United States Patent
Pedder (10) Patent No.: US 9,864,241 B1
(45) Date of Patent: Jan. 9, 2018

(54) DISPLAY STACK HAVING AN OPTICALLY TRANSPARENT CONDUCTOR AND POLARIZING LAYER

(71) Applicant: Apple Inc., Cupertino, CA (US)

(72) Inventor: James E. Pedder, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 272 days.

(21) Appl. No.: 14/574,019

(22) Filed: Dec. 17, 2014

Related U.S. Application Data (60) Provisional application No. 61/996,787, filed on May 14, 2014.

(51) Int. Cl.
| | | |
|---|---|---|
| *G02F 1/1335* | (2006.01) | |
| *G02F 1/136* | (2006.01) | |
| *G06F 3/044* | (2006.01) | |
| *G06F 3/047* | (2006.01) | |
| *G02F 1/1343* | (2006.01) | |
| *G02F 1/1333* | (2006.01) | |
| *G02F 1/1368* | (2006.01) | |
| *G06F 3/041* | (2006.01) | |
| *H01L 27/32* | (2006.01) | |

(52) U.S. Cl.
CPC ........ *G02F 1/13439* (2013.01); *G02F 1/1368* (2013.01); *G02F 1/13338* (2013.01); *G02F 1/133305* (2013.01); *G02F 1/133528* (2013.01); *G06F 3/044* (2013.01); *G06F 3/0414* (2013.01); *H01L 27/323* (2013.01)

(58) Field of Classification Search
CPC .... G02F 1/13338; G02F 3/0414; G02F 3/044; G02B 5/30–5/3075
See application file for complete search history.

(56) References Cited

U.S. PATENT DOCUMENTS

| | | | | |
|---|---|---|---|---|
| 9,400,346 | B2 * | 7/2016 | Kim | G02B 5/3058 |
| 2009/0052029 | A1 * | 2/2009 | Dai | G02B 5/3008 |
| | | | | 359/485.02 |
| 2009/0109377 | A1 * | 4/2009 | Sawaki | G02B 5/1814 |
| | | | | 349/96 |
| 2009/0273744 | A1 * | 11/2009 | Wang | G02B 5/3058 |
| | | | | 349/96 |
| 2012/0287507 | A1 * | 11/2012 | Lee | G02B 5/3058 |
| | | | | 359/492.01 |
| 2013/0300986 | A1 * | 11/2013 | Kang | G02B 5/3058 |
| | | | | 349/96 |
| 2014/0016043 | A1 * | 1/2014 | Chen | G06F 3/041 |
| | | | | 349/12 |
| 2014/0071357 | A1 * | 3/2014 | Kuo | G06F 1/1643 |
| | | | | 349/12 |
| 2016/0098110 | A1 * | 4/2016 | Choi | G06F 3/0416 |
| | | | | 345/173 |

OTHER PUBLICATIONS

Bau, et al., "TeslaTouch: Electrovibration for Touch Surfaces," UIST'10, Oct. 3-6, 2010, New York, New York USA, 10 pages.
Feist, "Samsung snags patent for new pressure sensitive touchscreens," posted on AndroidAuthority.com at URL: http://www.androidauthority.com/samsung-patent-pressure-sensitive-touch-screens-354860, Mar. 7, 2014, 1 page.

* cited by examiner

*Primary Examiner* — Mariceli Santiago
(74) *Attorney, Agent, or Firm* — Brownstein Hyatt Farber Schreck, LLP (57) ABSTRACT

An optically transparent conductive layer for a display stack. In some cases, the optically transparent conductive layer is a metal nanowire layer that is disposed on or near a polarizing layer within the display stack.

20 Claims, 8 Drawing Sheets

*(Section A-A)*

DISPLAY STACK HAVING AN OPTICALLY TRANSPARENT CONDUCTOR AND POLARIZING LAYER

CROSS-REFERENCE TO RELATED APPLICATION

This application claims the benefit under 35 U.S.C. §119(e) of U.S. Provisional Patent Application No. 61/996,787, filed on May 14, 2014, and entitled "Display Stack Having an Optically Transparent Conductor and Polarizing Layer," which is incorporated by reference as if fully disclosed herein.

TECHNICAL FIELD

Embodiments described herein generally relate to a display stack, and more specifically to an optically transparent and electrically conductive layer disposed on a polarizing layer of a display stack and methods of manufacturing the same.

BACKGROUND

Many electronic devices include some type of user input device, including, for example, buttons, slides, scroll wheels, and similar devices or user-input elements. Some devices may include a touch sensor that is integrated or incorporated with a display screen. The touch sensor may allow a user to interact directly with user-interface elements that are presented on the display screen. However, there are several challenges associated with integrating a touch sensor with a display. In some cases, electrical noise or signals generated by the display or other electrical components of the device may interfere with the operation of some touch sensors. Additionally, electrical conductors used to form part of the sensor may need to be optically transparent or not otherwise significantly degrade the optical performance of the display. In some cases, it may be challenging to achieve both the optical and electrical performance desired for an electrical conductor or conductive sheet.

SUMMARY

Embodiments described herein may relate to, include, or take the form of an optically transparent conductive element that may be integrated or incorporated into a touch-sensitive surface of an electronic device. In some examples, the embodiments described herein relate to one or more optically transparent conductive layers integrated into a display stack.

Some example embodiments include an electronic device having a touch-sensitive surface. The device may include an enclosure and a thin-film transistor (TFT) layer of a liquid-crystal display positioned within the enclosure. The device may also include a cover disposed over the display and forming at least a portion of the touch-sensitive surface of the device. The device may include a polarizer layer disposed below the TFT layer, and a transparent conductive layer disposed adjacent to the polarizer layer and including a metal nanowire material. In some embodiments, the polarizer layer is a rear polarizer of the liquid-crystal display. In some embodiments, the transparent conductive layer is disposed adjacent to a lower side of the polarizer layer that is opposite to an upper side that faces the TFT layer. In some cases, the transparent conductive layer is disposed between the polarizer layer and a backlight used to illuminate the liquid-crystal display. In some embodiments, transparent conductive layer is disposed adjacent to an upper side of the polarizer layer that that faces the TFT layer.

In some example embodiments, the transparent conductive layer includes a substantially randomized distribution of metal nanowires and has a substantially isotropic sheet resistance. In some embodiments, the metal nanowires of the transparent conductive layer are generally oriented along a first direction and the transparent conductive layer has a substantially anisotropic sheet resistance. In some embodiments, the metal nanowires are generally oriented along a first direction and the transparent conductive layer is configured to have an increased transparency for light polarized relative to the first direction.

In some example embodiments, the device also includes an electrode layer disposed below the transparent conductive layer. The electrode layer and the transparent conductive layer may be operatively coupled to sensing circuitry and are configured to detect a force on the cover of the device. In some embodiments, the electrode layer includes a set or array of capacitive sensing electrodes. In some embodiments, the device includes a touch sensor disposed between the cover and the TFT layer of the liquid-crystal display, and a force sensor disposed below the TFT layer of the liquid-crystal display. In some implementations, the transparent conductive layer shields the touch sensor from electrical noise generated by the force sensor.

In some embodiments, the transparent conductive layer is electrically coupled to the TFT layer. In some cases, the transparent conductive layer is electrically connected to the TFT layer by a separate electrical connector, such as a jumper element. In some cases, the transparent conductive layer and the polarizer layer for a flexible laminate, and the transparent conductive layer is electrically connected to the TFT layer by a portion of the flexible laminate bent toward the TFT layer and in electrical contact with the TFT layer.

Some example embodiments include an electronic device having a touch-sensitive surface. The device may include an enclosure and an organic light emitting display positioned within the enclosure. The device may also include a cover disposed over the display and forming at least a portion of the touch-sensitive surface of the device. The device may also include a polarizer layer disposed between the cover and the organic light emitting display. A transparent conductive layer may be disposed between the polarizer layer and the organic light emitting display. In some cases, the transparent conductive layer is formed from a metallic nanowire material. The device may also include a circular polarizing layer disposed between the polarizer layer and the organic light emitting display. The polarizing layer and the circular polarizing layer may be configured to reduce the back reflection caused by the transparent conductive layer. In some embodiments, the metal nanowires are generally oriented along a first direction and the transparent conductive layer is configured to have an increased transparency for light polarized relative to the first direction.

In some example embodiments, an electrode layer is disposed below the transparent conductive layer. The electrode layer and the transparent conductive layer may be operatively coupled to sensing circuitry and are configured to detect a force on the cover of the device. In some cases, the device also includes a touch sensor disposed between the cover and the organic light emitting display. A force sensor may be disposed below the touch sensor. The transparent conductive layer may shield the touch sensor from electrical noise generated by the force sensor. In some cases, the transparent conductive layer shields the touch sensor from electrical noise generated from components disposed within the enclosure of the device.

Some example embodiments are directed to a method of forming a transparent conductive layer. The method may include depositing a nanowire solution on a surface of a substrate. In some cases, the nanowire solution includes a metal nanowire material and a liquid solvent. In some implementations, the nanowire solution is subjected to a shear condition as it is being deposited on the surface of the substrate in the metal nanowire material being oriented along a first direction. After deposition, the liquid solvent may be evaporated to fix the metal nanowire material while oriented along the first direction. In some embodiments, the nanowire solution is deposited using a roll-to-roll process.

BRIEF DESCRIPTION OF THE FIGURES

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

The use of the same or similar reference numerals in different figures indicates similar, related, or identical items.

DETAILED DESCRIPTION

Embodiments and examples provided herein are directed to devices and products having a touch-sensitive surface integrated or incorporated with the display of the device. Example devices may include a touch sensor for detecting and estimating a location of a touch on the touch-sensitive surface. Example devices may also include a force sensor for detecting and measuring a force applied to the touch-sensitive surface. Example devices, include, without limitation, mobile telephones, smart phones, personal digital assistants, tablet computers, laptop computers, track pads, wearable devices, health monitoring devices, sports accessory devices, peripheral input devices, and the like.

A touch sensor and/or force sensor that is integrated with a display stack may include one or more electrically conducting layers, which in some cases, are also optically transparent. Optically transparent conductors may allow the portions of the sensor to overlap with a viewable portion of the display or other visual component without significantly impairing the optical performance of the display. Example optically transparent conductive layers may be formed from materials, such as indium tin oxide ("ITO") or other similar metal oxide compositions. However, in some applications, some traditional metal oxide conductors may have a sheet resistance that is too high to achieve the desired performance. In some cases, to improve the sheet resistance of an ITO layer, a conductive ink may be applied to regions of the layer. However, use of a conductive inks may, in some cases, affect the reliability of the sensor and may also impair the adhesion properties between components of the display stack.

One alternative to ITO is to form a transparent conductive layer using a metal nanowire or other conductive particles formed into or deposited on a sheet or film. Some metal nanowire compositions may exhibit reduced sheet resistance as compared to some metal oxides, such as ITO. The reduced sheet resistance may be particularly advantageous for forming a shield or drive layer of a force sensor incorporated with a display. However, in some cases, metal nanowire compositions may diffuse light and appear hazy or milky when incorporated into a display stack. Embodiments described herein may be used to improve the optical performance of metal nanowire layers while providing conductive elements that have reduced sheet resistance as compared to some traditional techniques.

Embodiments described herein may relate to, include, or take the form of optically transparent layers of a display stack conductance or sheet resistance that is suitable for forming a shield or drive layer of a sensor. Many embodiments include a layer of metal nanowires embedded or formed within a substrate. In particular, a metal nanowire layer may include a layer formed from silver nanowires ("AgNW" or "AgNW layer") formed within a substrate and disposed within a display stack. In some embodiments, an AgNW layer may include a plurality of silver nanowires disposed within an optically transparent matrix such as a polymer or cured adhesive. In still further examples, the silver nanowires may be introduced or integrally formed with an optically transparent material, such as glass. In other examples, individual nanowires may be deposited directly on the surface of one or more layers of the display stack.

To reduce the optical effects of the AgNW layer, in some embodiments, the AgNW layer is disposed relative to or directly on a polarizer layer. The polarizer layer may be formed form a polarizer film including linear and/or circular polarizers. Further embodiments include a configuration in which individual nanowires are arranged or substantially aligned to enhance optical transparency or provide an optical characteristic. For example, some embodiments may include an AgNW layer having all or substantially all nanowires substantially aligned along a single direction. In these examples, the AgNW layer may block or otherwise reflect all light that is not aligned relative to the direction of the orientation of the silver nanowires. In some cases, the AgNW layer may have enhanced optical transparency to light polarized along the direction of orientation of the nanowires. In some embodiments, the silver nanowires of the layer are arranged in a pattern such as a grid. In some embodiments, the silver nanowires are arranged in a substantially isotropic distribution. Alternatively, the silver nanowires may be arranged in an anisotropic distribution to enhance optical transparency with respect to polarized light.

Some embodiments may include configurations that are configured to reduce the amount of light reflected from the AgNW layer. For example, some configurations include a low-reflection display stack that may have improved visibility under bright environmental conditions. In some embodiments, a separate polarizing filter may be disposed above or below the AgNW layer to decrease reflected light. In one example, the polarizing filter may include linear polarizer disposed above a quarter-wave retarder, which may be disposed above an AgNW layer and a display element. In this configuration, light passing through the linear polarizer becomes aligned along the transmission axis of the linear polarizer. Light passing through the quarter-wave retarder may become circularly polarized. For example, the quarter-wave retarder may create light that is either right-hand or left-hand polarized. In one example, right-hand circularly polarized light may partially pass through the AgNW layer and may be partially reflected by the AgNW layer or another layer in the stack. The reflected light may be, for example, left-hand circularly polarized as a result of the reflection. The left-hand circularly polarized reflected light may then be converted to linearly polarized light after passing back through the quarter wave retarder. The polarization vector after passing through the circular polarizer a second time may, in this example, be perpendicular to the direction allowed to pass through the linear polarizer, and is therefore blocked by the linear polarizer. In another example, the quarter-wave retarder produces left-hand polarized light and blocks reflected light in a similar manner. In some cases, the AgNW layer may also have polarizing properties which may enhance this effect and further improve the optical properties of the display.

Some embodiments include methods and systems for manufacturing optically clear conductors having individual nanowires aligned along a single direction. In some implementations, the aligned nanowires facilitate optical or electrical properties of a conductive layer disposed within a display stack. In one example, individual nanowires are suspended in a solvent and/or other carrier to form a depositing solution that may be passed through an aperture and deposited onto a substrate. The solution may be deposited to a substantially uniform thickness by passing a substrate under the aperture and/or, by moving the aperture over the substrate at a selected velocity.

In some embodiments, the pressure at which the solution is applied to the substrate and the rate at which the solution is deposited may induce or otherwise influence a shear force within the uncured solution deposited on the substrate. For example, at certain deposition pressures, the solution may be drawn to shear in the direction of movement of the substrate (or aperture) by the differential between the velocity of the portion of the solution interfacing the aperture and the velocity of the portion of the solution interfacing the substrate. The resulting shear force may encourage individual nanowires to linearly align in the direction of the shear force. Thereafter, the solution may be cured or a solvent evaporated to fix the alignment of the individual nanowires.

In some instances, silver nanowires integrated or formed into a conductive layer may have higher conductance as compared to some metal oxides traditionally used as transparent conductors. Accordingly, an AgNW layer deposited to the same thickness as a traditional metal oxide may have a higher conductance than other types of conductive layers. In other examples, the AgNW layer may be deposited as a thinner layer than a traditional metal oxide layer, reducing the overall thickness of the display stack. In still further examples, the AgNW layer may be bent, formed, or otherwise deformed around other components within the display stack, allowing for faster and more cost-effective manufacture than some more fragile metal oxide materials.

In some instances, a AgNW layer may confer additional benefits over some metal oxide layers. For example, in certain embodiments, a AgNW layer may provide a passive function such as electromagnetic shielding. In other embodiments, a AgNW layer may be included within a circuit configured to detect user input such as a touch sensor. In still further embodiments the AgNW layer may be formed as conductive traces to provide electrical connections across or through a display stack. For example, AgNW may be deposited in through-holes of various layers of a display stack to provide an optically transparent via.

Although many embodiments discussed herein reference silver, other suitable metal or metallic nanowires or nanoparticles may be suitable for inclusion in certain further embodiments. For example, other metallic nanowires (e.g., nickel, gold, platinum) may be substituted for or mixed with silver nanowires to provide features, functions and characteristics desirable for certain configurations of particular embodiments. For example, platinum nanowires may be mixed with silver nanowires in select ratios in order to provide a particular conductance, shielding effect, or optical transparency profile.

Figure 1:
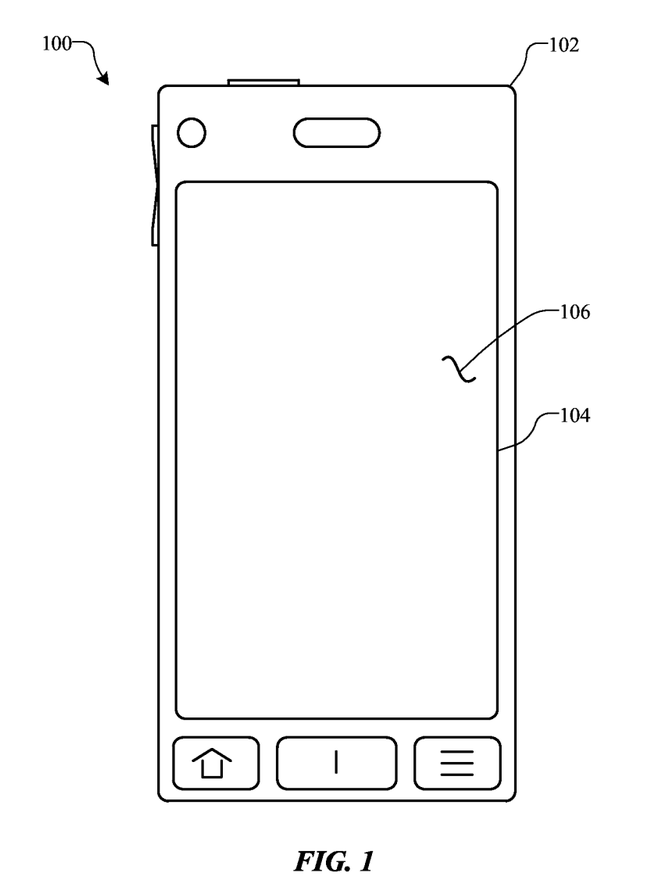
FIG. 1 depicts an example electronic device having a touch-sensitive surface.

FIG. 1 depicts an example electronic device 100. The electronic device 100 may include a display 104 disposed or positioned within an enclosure 102. The display 104 may include a stack of multiple elements including, for example, a display element, a touch sensor layer, a force sensor layer, and other elements. The display 104 may include a liquid-crystal display (LCD) element, organic light emitting diode (OLED) element, electroluminescent display (ELD), and the like. The display 104 may also include other layers for improving the structural or optical performance of the display, including, for example, glass sheets, polymer sheets, polarizer sheets, color masks, and the like. The display 104 may also be integrated or incorporated with a cover 106, which forms part of the exterior surface of the device 100. Example display stacks depicting some example layer elements are described in more detail below with respect to FIGS. 3-7.

In some embodiments, a touch sensor and or a force sensor are integrated or incorporated with the display 104. In some embodiments, the touch and/or force sensor enable a touch-sensitive surface on the device 100. In the present example, a touch and/or force sensor are used to form a touch-sensitive surface over at least a portion of the exterior surface of the cover 106. The touch sensor may include, for example, a capacitive touch sensor, a resistive touch sensor, or other device that is configured to detect the occurrence and/or location of a touch on the cover 106. The force sensor may include a capacitive force sensor similar to the force sensor described below with respect to FIG. 6.

In some embodiments, each of the layers of the display 104 may be adhered together with an optically transparent adhesive. In other embodiments, each of the layers of the display 104 may be attached or deposited onto separate substrates that may be laminated or bonded to each other. The display 104 may also include other layers for improving the structural or optical performance of the display, including, for example, glass sheets, polarizer sheets, color masks, and the like. Representative display stacks are described in more detail below with respect to FIGS. 2-7.

Figure 2:
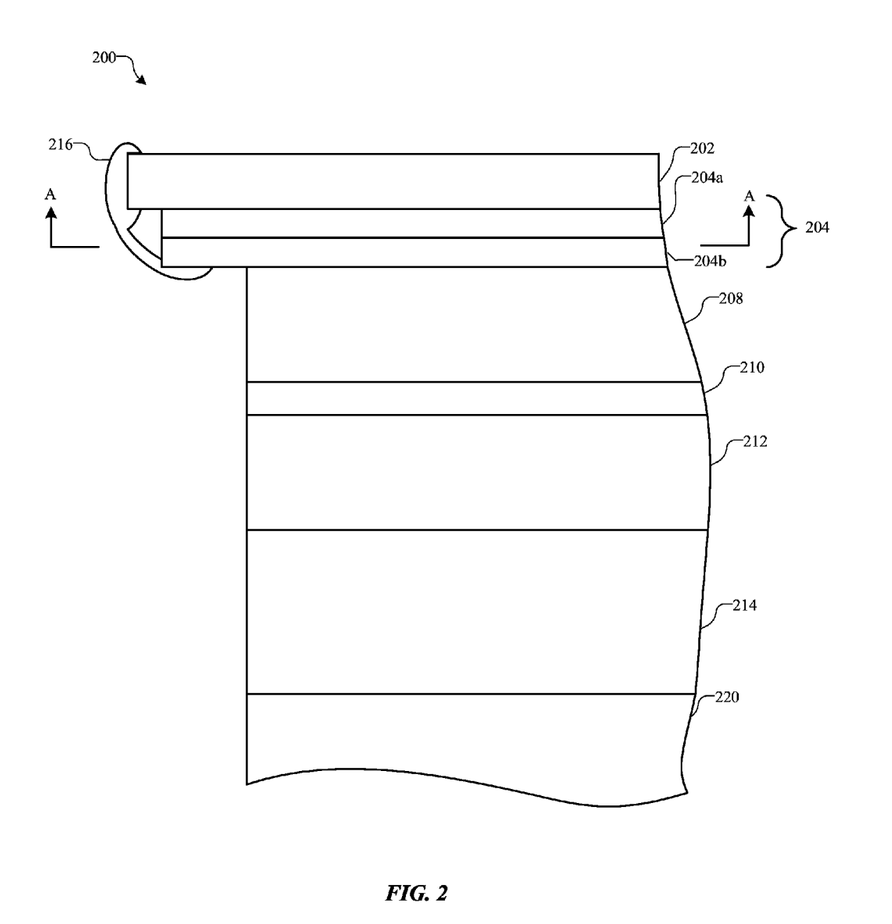
FIG. 2 depicts an example side cross-sectional view of a display stack including a conductance-enhancing perimeter ring.

FIG. 2 depicts an example side cross-section view of a display stack 200 including a conductance-enhancing perimeter ring. As previously discussed, the display stack 200 may be included within an electronic device. For example, in many embodiments, the display stack 200 may be included within the housing of a portable electronic device, such as a cellular phone, smart phone, tablet computer, desktop computer, wearable device, heath monitoring device, sports device, accessory device, peripheral input device, or other electronic device. For simplicity, some elements of the display stack are omitted from the illustrate of FIG. 2. In particular, the display stack 200 may also incorporate a cover, a touch sensor, and various other layers.

The displays stack 200 may include several layers adhered or bonded to one another. For example, the display stack 200 may include a thin-film transistor ("TFT") layer 202 disposed above an optically clear electrode sheet such as ITO layer 204. By placing the ITO layer 204 adjacent or near to the TFT layer 202, an electrical connection between the two may be established by connection 216. To improve the conductance of the ITO layer 204, as shown in FIG. 2, the stack may include a silver ink perimeter ring 204b that is electrically coupled to the ITO layer 204.

Figure 3:
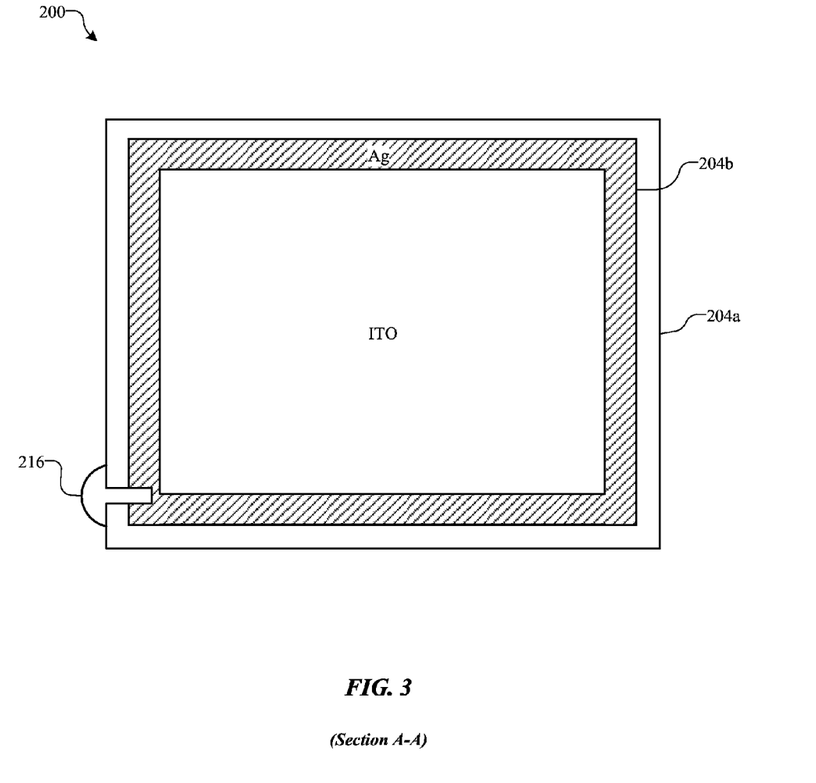
FIG. 3 depicts an example top plan view of the display stack of FIG. 1 taken along section A-A.

The silver ink perimeter ring 204b is depicted in FIG. 3. As shown in FIG. 3, the silver ink perimeter ring 204b is formed around the edges of the electrode layer 204. Because the silver ink perimeter ring 204b is substantially opaque, it is only formed over regions of the electrode layer 204 that do not affect the optical performance of the stack 200. Thus, in some cases, the silver ink perimeter ring 204b can be used to form an electrode layer 204 that is optically transparent over some portions and having improved conductance as compared to some ITO layers. The silver ink perimeter ring 204b may be deposited using, for example, an inkjet printing process. The optically transparent electrode layer 204 may be electrically coupled to the TFT layer 202 via the jumper connection 216.

With reference to FIG. 2, the display stack 200 may include other components below the ITO layer 204a. For example, positioned below the ITO layer 204a and the silver ink perimeter ring 204b may be a layer of pressure sensitive adhesive ("PSA") 208 used to attach a polymeric protective layer such as a polyvinyl alcohol ("PVA") layer 210 to the electrode layer 204. Disposed below the PVA layer 210 may be an insulator made from a plastic or organic compound such to form, for example, a cellulous triacetate ("CAT") layer 212. Disposed below the CAT layer 212 may be a polarizer layer 214, including a polarizing film, such as the Advanced Polarizer Control Film ("APCF") manufactured by 3M. In some cases, the polarizer layer 214 may function as a rear polarizer for the liquid-crystal display of the display stack 200. The display stack 200 depicted in FIG. 2 may also be placed above a light source such as a backlight unit 220 used to illuminate the liquid-crystal display associated with the TFT layer 202. Thus, in some embodiments, the ITO layer 204a must pass optically polarized light to the TFT layer 202 of the LCD without significantly degrading the amount or polarization angle of the light.

In the configuration of FIG. 2, the silver ink perimeter ring 204b acts as a parallel resistor with the ITO layer 204a, and thus reduces the effective resistance of the ITO layer 204a. The thickness of the silver ink perimeter ring 204b may be selected to provide a particular effective resistance with the ITO layer 204a. For example, a relatively thick application of the silver ink perimeter ring 204b may provide for greater conductivity than a relatively thin application of the same. While the configuration depicted in FIG. 2 may improve the conductivity of the ITO layer 204a, the application of the silver ink perimeter ring 204b is limited to the perimeter of the display stack so that the ring does not interfere or block the display of the device. Additionally, the use of a silver ink perimeter ring 204b may affect the reliability of the device and may also impair the adhesion or bonding properties between some layers of the stack 200.

In some cases, functionality provided by the ITO and silver ink layer may accomplished using a metal nanowire (e.g., AgNW) layer integrated into the stack. The embodiments described herein with respect to FIGS. 4, 5, 6, and 7A-E are directed to a stack having a metal nanowire layer that is disposed on or near a polarizing layer. In particular, in some embodiments, a metal nanowire layer may be implemented to improve the conductivity of a conductive layer within the display stack. The metal nanowire layer may also be positioned relative to a polarizing layer in a location that reduces or eliminates undesirable optical effects or artifacts associated with the use of some metal nanowire materials.

Figure 4:
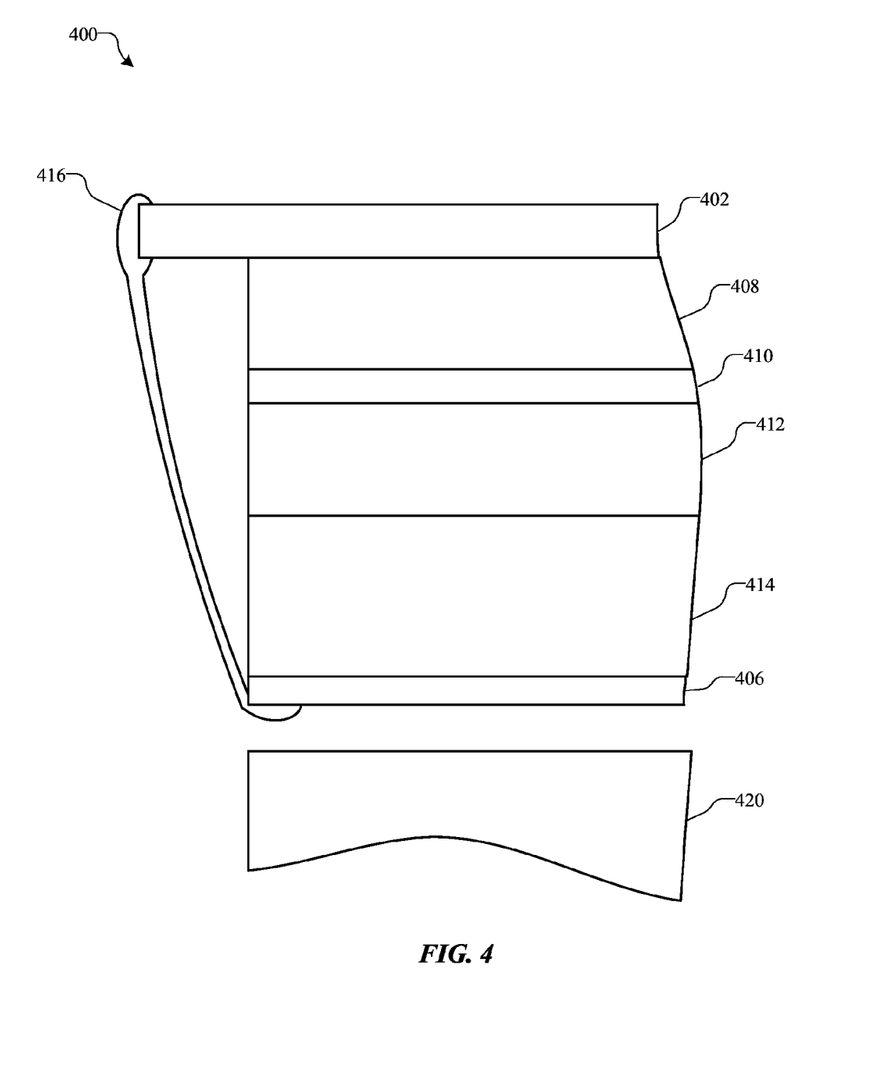
FIG. 4 depicts an example side cross-sectional view of a display stack including an optically transparent layer disposed on a polarizing layer.

FIG. 4 depicts an example side cross-sectional view of a display stack 400 including an optically transparent layer 406. In this example, the display stack 400 includes a TFT layer 402 disposed above a PSA layer 408 which couples the TFT layer 402 to PVA layer 410. In this example, a CAT layer 412 and a polarizer layer 414 (e.g., an APCF layer) are disposed below the PVA layer 410. In some cases, the polarizer layer 414 may function as a rear polarizer for the liquid-crystal display of the display stack 400.

As shown in FIG. 4, a metal nanowire layer 406 (e.g., an AgNW layer) is disposed relative to the polarizer layer 414 (e.g., APCF layer). In particular, the metal nanowire layer 406 is disposed relative to a surface of the polarizer layer 414 that is opposite to a surface that faces the TFT layer 402. The metal nanowire layer 406 is also disposed between the polarizer layer 414 and the display backlight 420. The display backlight 420 may be directly coupled to the metal nanowire layer 406 or, as shown in FIG. 4, the display backlight 420 may be spaced apart from the metal nanowire layer 406. In some cases, the space between the display backlight 420 and other elements of the stack 400 facilitates the operation of a capacitive force sensor (similar to the configuration described below with respect to FIG. 6). As shown in FIG. 4, the metal nanowire layer 406 may be electrically coupled to the TFT 402 via jumper connection 416. The jumper connection 416 may include one or more conductive elements, including, without limitation conductive wire, conductive flexible conduit, ribbon cable, and the like.

In contrast to the silver ink of FIG. 1, the metal nanowire layer 406 may extend over a substantial portion of the area of the display stack 400. In some embodiments, the metal nanowire layer 406 may include a plurality of silver nanowires disposed within an optically transparent matrix, such as an adhesive or polymer. In still further examples, the metal nanowire layer 406 may be introduced as a dopant to an optically transparent material, such as glass, polycarbonate, or similar substrate. In other examples, individual nanowires may be deposited directly on the surface of one or more layers within the display stack 400. In some cases, the metal nanowire layer 406 may have a higher conductance than the ITO layer 204a, as depicted in FIG. 2. In some cases, the metal nanowire layer 406 may have a conductance that is particularly suitable for use as an electrode for a force sensor (see, e.g., FIG. 6). In some cases, the metal nanowire layer 406 may also dissipate less power than a comparable ITO layer. In some cases, the nanowire layer 406 may provide effective shielding for a touch sensor or other electronic component within the device.

In some cases, the metal nanowire layer 406 may be formed having nanowires substantially oriented along a single direction. The formation of an example nanowire layer having oriented nanowires is described in more detail below with respect to FIGS. 8A-C. In some implementations, the oriented or aligned nanowires may improve light transmission and/or light recycling properties of the layer. In particular, with respect to the embodiment depicted in FIG. 4, the metal nanowire layer 406 may be disposed relative to a surface of the polarizing layer 414 facing the backlight 420. In some cases, the metal nanowire layer 406 may be configured to pass light that is substantially aligned with the polarizing axis of the polarizer layer 414, which may enhance light transmission properties from the backlight 420 to the other elements of the (liquid crystal) display.

Figure 5:
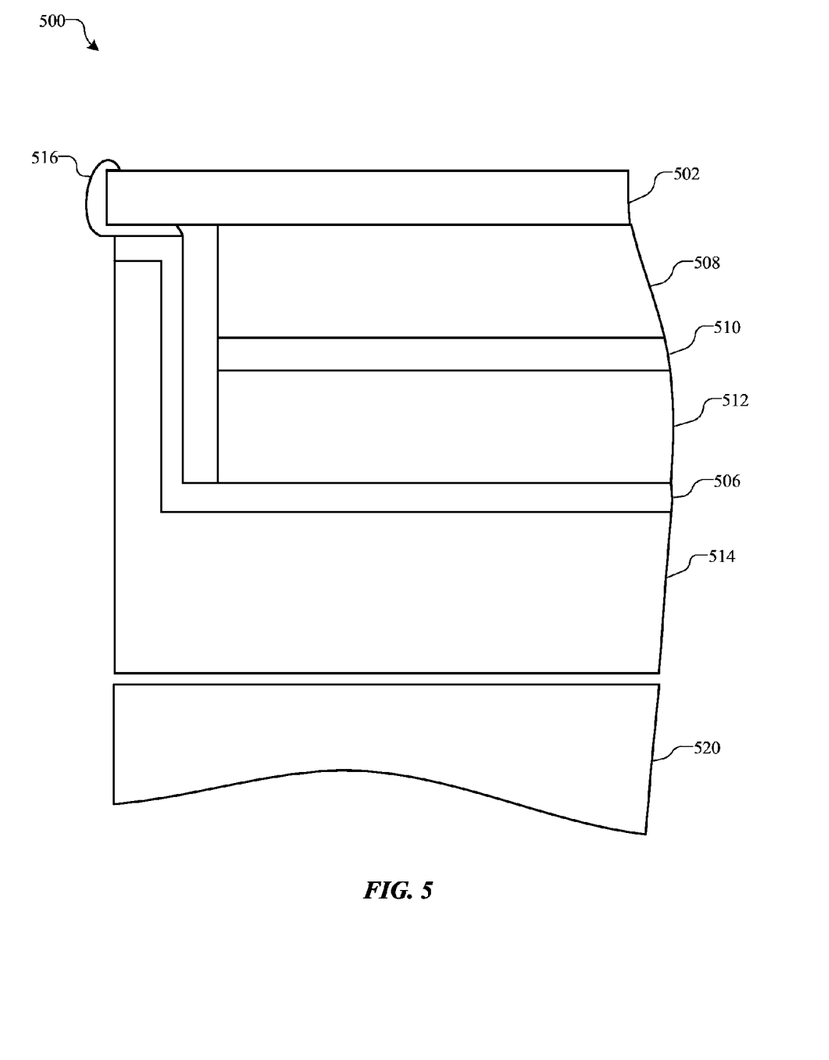
FIG. 5 depicts an example side cross-section view of a display stack including an overlapping optically transparent layer disposed on a polarizing layer.

FIG. 5 depicts an example side cross-section view of a display stack 500 including an overlapping optically transparent layer. Similar to the embodiment depicted in FIG. 4, the display stack 500 may include a TFT layer 502 disposed above a PSA layer 508 which couples the TFT layer 502 to PVA layer 510. In this example, a CAT layer 512 is disposed below the PVA layer 510. A polarizer layer 514 is disposed below the CAT layer 512. As shown in FIG. 5, the metal nanowire layer 506 is disposed above the polarizer layer 514. The metal nanowire layer 506 is also disposed on a side of the polarizer layer 514 that is opposite to the display backlight 520. The display backlight 520 may be directly coupled to the metal nanowire layer 506 or, as shown in FIG. 5, the display backlight 520 may be spaced apart from the metal nanowire layer 506. In some cases, the space between the display backlight 520 and other elements of the stack 500 facilitates the operation of a capacitive force sensor (similar to the configuration described below with respect to FIG. 6).

In some embodiments, both the metal nanowire layer 506 and the polarizer layer 514 may be formed as a flexible laminate. In this example, the metal nanowire layer 506 and the polarizer layer 514 are deformed or otherwise bent around the edge of the display stack 500 in order to make electrical contact with the TFT layer 502. In this manner, the TFT layer 502 may be electrically connected to the metal nanowire layer 506 via an electrical connection 516 (e.g., jumper, solder joint, or terminal). Additionally or alternatively, the metal nanowire layer 506 may be electrically coupled to the TFT layer 502 (or another element) using a separate connector.

Figure 6:
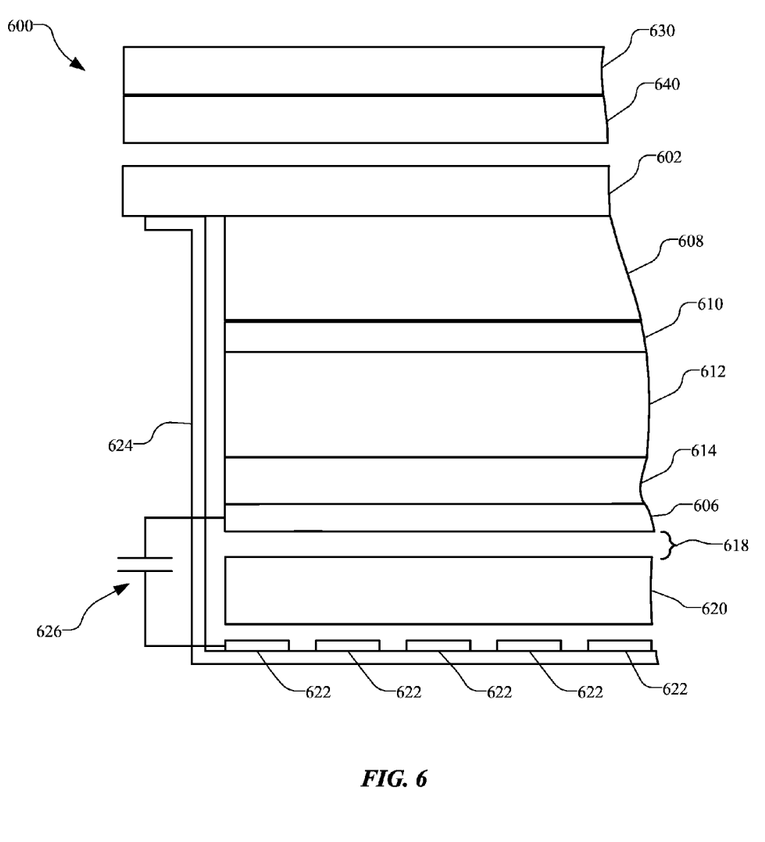
FIG. 6 depicts an example side cross-sectional view of a display stack including an optically transparent layer disposed on a polarizing layer and forming part of a capacitive force sensor.

FIG. 6 depicts an example side cross-sectional view of a display stack 600 including an optically transparent layer within a force sensor. As shown in FIG. 6, the display stack 600 may include a cover 630 disposed above a touch sensor 640, which is disposed above the other elements of the display stack 600. The touch sensor 640 may include a capacitive, resistive, or other type of sensor that is configured to detect the occurrence and/or location of a touch on the surface of the cover 630. In some embodiments, the cover 630 forms an exterior surface of an electronic device. The display stack 600 also include a force sensor formed using the nanowire layer 606 and an array or set of capacitive sensor electrodes 622 described in more detail below. The force sensor may be configured to detect and measure the amount of force applied (e.g., by a touch) on the surface of the cover 630. In some cases, the cover 630 forms a touch-sensitive surface of the device. In this example, the cover 630 and the touch sensor 640 are disposed above the TFT layer 602 but may not be directly connected to the TFT layer 602. In particular, one or more additional layers may be disposed between the touch sensor 640 and the TFT layer 602, which have been omitted from FIG. 6 for clarity.

As shown in FIG. 6, the display stack 600 may include a TFT layer 602 disposed above a PSA layer 608 which couples the TFT layer 602 to PVA layer 610. A CAT layer 612 is disposed below the PVA layer 610. A light recycling layer or polarizing layer 614 is disposed below the CAT layer 612. The light recycling, polarizing layer 614 may polarize light produced by the backlight 620. In this example, the metal nanowire layer 606 (e.g., a AgNW layer) is disposed below the polarizing layer 614. Alternatively, in some embodiments, the metal nanowire layer 606 may be disposed above the polarizing layer 614.

In this example, the display stack 600 is coupled to a brace or bracket 624 that provides a structural support. Positioned below the metal nanowire layer 606 may be a backlight 620 configured to direct broad spectrum visible light through the layers above. In some case, the backlight 620 may emit white light. The backlight 620 may be separated from the metal nanowire layer 606 by an air gap 618. In this example, the upper layers above the air gap 618 (e.g., the metal nanowire layer 606, the polarizing layer 614, the CAT layer 612, the PVA layer 610, the PSA layer 608 and the TFT layer 602) may bend, deform, or otherwise deflect upon receiving a force at the TFT layer 602. For example, a user may press down upon the TFT layer 602. The downward pressing force applied by the user may cause the stack to deform into the air gap 618. In this manner, the backlight 620 may be protected from deforming in response to a user's input force. Positioned below the backlight may be one or more capacitive sensor electrodes 622. The individual capacitive sensor electrode may be used to measure an effective capacitance 626 between the capacitive sensor electrodes 622 and the metal nanowire layer 606. As may be appreciated, the capacitance 626 will change in response to deflection, deformation, or bending as a result of a downward user force. In some cases, the capacitance 626 may be used to calculate the force as applied to the surface of the TFT layer 602. The capacitance 626 may be measured using capacitive monitoring or sensing circuitry that is operatively coupled to the metal nanowire layer 606 and the capacitive sensor electrodes 622. The sensing circuitry may include circuitry or logic for detecting a change in the capacitance 626 and predict a force of a touch on a surface of the display stack 600. Accordingly, the metal nanowire layer 606 may function as a portion of an force sensor. More particularly, the metal nanowire layer 606 may be integrated into a display stack and be used as a component of a force sensor.

In some embodiments, the metal nanowire layer 606 may function as a shield between electrical elements of the device. For example, the metal nanowire layer 606 may shield the touch sensor layer 640 from electrical noise produced by the capacitive sensor electrodes 622 or other electrical elements located below the metal nanowire layer 606. In some cases, the metal nanowire layer 606 is grounded or is maintained at a substantially fixed voltage to facilitate the shielding of the touch sensor layer 640.

In some embodiments, the metal nanowire layer 606 has uniform optical properties and is substantially optically transparent. In alternative embodiments, the metal nanowire layer 606 may be configured to provide a polarizing effect to light passing from the backlight 620 to the polarizing layer 614. For example, in one example embodiment, the metal nanowire layer 606 may have all or substantially all nanowires substantially aligned along the an axis or direction. In this case, the metal nanowire layer 606 may block or otherwise reflect all light that is not aligned along the axis or direction of nanowire alignment. In some cases, the metal nanowire layer 606 may have enhanced optical transparency to light polarized along the alignment axis. Accordingly, the metal nanowire layer 606 may be aligned with the light recycling, polarizing layer 614 such that the alignment axis of the individual nanowires substantially aligns with the transmission axis of the light recycling, polarizing layer 614. This configuration may increase the effectiveness of the polarizer and improve the optical performance of the display stack 600.

Figure 7A:
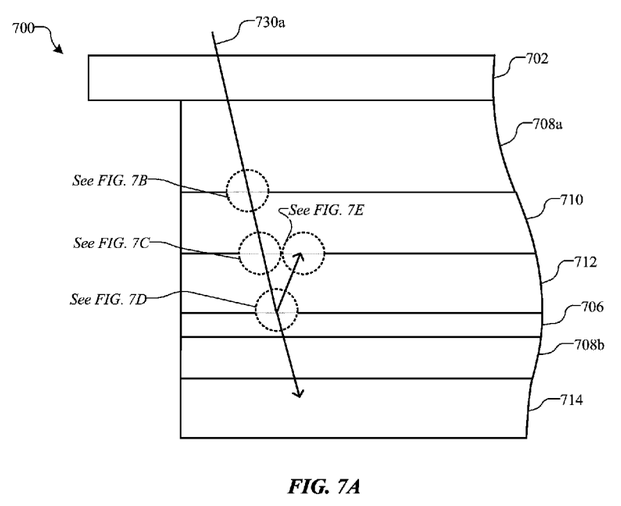
FIG. 7A depicts an example side cross-section view of a display stack including a polarizing filter and an optically transparent layer.

FIG. 7A depicts an example side cross-sectional view of a low-reflection display stack 700 including a polarizing filter and an optically transparent layer disposed over an display element. This configuration may reduce the amount of light reflected from a metal nanowire layer 706 (e.g., a AgNW layer) or other layer in the stack 700. As shown in FIG. 7A, the display stack 700 may include an organic light emitting diode (OLED) display 714 attached to other elements of the display stack 700 by pressure sensitive adhesive (PSA) layer 708b.

As depicted in FIG. 7A, a low-reflection display stack 700 may include a multi-part polarizing filter disposed above the metal nanowire layer 706. As shown in FIG. 7A, the display stack 700 may include a cover glass 702 disposed above a first PSA layer 708a which may couple the cover glass 702 to a linear polarizer 710. In this example, a quarter-wave retarder 712 is disposed below the linear polarizer 710. The metal nanowire layer 706 is disposed between the quarter-wave retarder 712 and the OLED display 714.

Figure 7B:
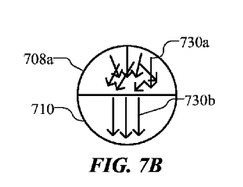
FIG. 7B-7E depict simplified detail views of the path of external light through the display stack as shown in FIG. 7A.
Figure 7C:
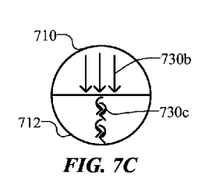
Figure 7D:
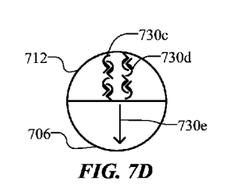
Figure 7E:
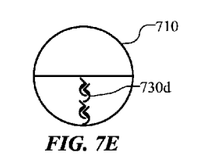

As shown in FIG. 7B, randomly oriented light 730a passing through the linear polarizer 710 may become polarized light 730b, aligned along the transmission axis of the linear polarizer 710. Polarized light 730b through the quarter-wave retarder 712 may become circularly polarized light 730c (see, e.g., FIG. 7C). In certain embodiments, the quarter-wave retarder 712 may circularly polarize in a right-hand orientation or, in other embodiments, the quarter-wave retarder 712 may circularly polarize in a left-hand orientation.

In the configuration depicted FIG. 7A, the quarter-wave retarder 712 is positioned above the metal nanowire layer 706 and may help reduce back reflection caused by the metal nanowire layer 706. As described above, individual nanowires of the metal nanowire layer 706 may be reflect a portion of light, for example reflected light 730d (see, FIG. 7D). In some examples, a certain amount of light 730e may pass through the metal nanowire layer 706. (see, e.g., FIG. 7D), a portion of which may be reflected by the OLED display 714. In many embodiments, the reflected light 730d may undesirably interfere with the visibility of the display stack 700. However, because reflected light 730d is a reflection of the circularly polarized light 730c, the reflected light 730d will have the opposite circular polarity of the circularly polarized light 730c (see, e.g., FIG. 7D). For example, if circularly polarized light 730c has a right-hand polarity, reflected light 730d will have a left-hand polarity. The left-hand circularly polarized reflected light 730d may then be converted to linearly polarized light after passing through the quarter wave retarder 712. The polarization vector after passing through the quarter-wave retarder 712 (a second time) is perpendicular to the direction allowed to pass through the linear polarizer 710, and is therefore blocked by the linear polarizer 710. (See, e.g., FIG. 7E.) In this manner, some or substantially all of the light reflected by the metal nanowire layer 706 may be prevented from exiting the display stack 700. The configuration depicted in FIGS. 7A-E may also be used to reduce or prevent the reflection of light from other components in the display stack disposed below the metal nanowire layer 706.

Additionally, in some cases, the metal nanowire layer 706 may be configured to have polarizing properties and, in some cases, may be used to enhance the anti-reflection function of the polarizing layers 710, 712, of the stack 700. For example, the metal nanowire layer 706 may be formed having nanowires substantially aligned along an axis or direction. The alignment of the nanowires may perform a polarizing function, as discussed with respect to the examples provided above. Additionally or alternatively, the metal nanowire layer 706 may be used in place of or integrated with either or both of the linear polarizer 710 and the quarter-wave retarder 712.

Figure 8A:
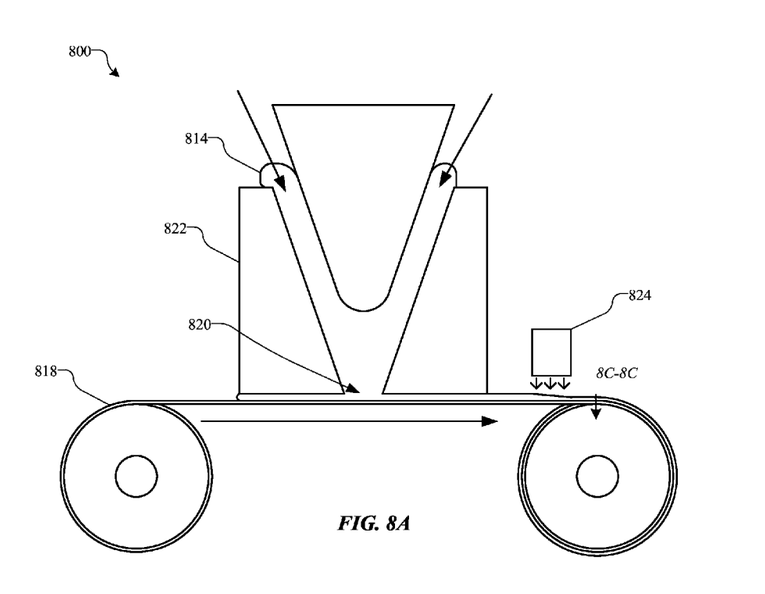
FIG. 8A depicts an example manufacturing technique for depositing nanowires to a substrate in a substantially parallel alignment.

FIG. 8A depicts an example manufacturing technique for depositing nanowires on a substrate. In particular, the technique described with respect to FIGS. 8A-C can be used to form a metal nanowire or an AgNW layer having nanowires that are substantially aligned along an axis or direction. In one example, individual nanowires may be suspended in a liquid solvent and/or other carrier matrix to form a depositing solution 814 that may be passed through an aperture 820 and deposited onto a substrate 818. The solution 814 may be guided through a funnel 822 (or other depositing structure) through the aperture 820 in order to be deposited on the substrate 818 at a substantially uniform thickness. In some embodiments, the substrate 818 may be rolled below the fixed aperture 820 at a fixed or variable velocity. Alternatively, the aperture 820 may be movable or configured to pass over the substrate 818 at a fixed or variable velocity.

Figure 8B:
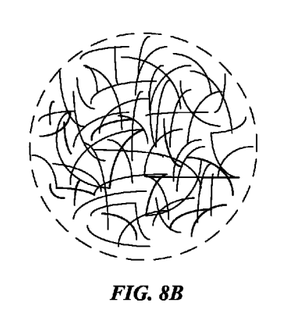
FIG. 8B depicts an example detail view of silver nanowires aligned substantially randomly.
Figure 8C:
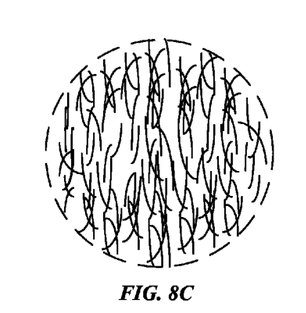
FIG. 8C depicts an example detail view of silver nanowires substantially aligned along an axis.

In some cases, the size of the aperture 820, the pressure at which the solution 814 is applied to the substrate 818, or the rate at which the solution 814 is deposited may induce or otherwise influence a linear shear force within the uncured solution 814 that is deposited on the substrate 818. For example, at certain deposition pressures, the solution 814 may be drawn to shear in the direction of movement of the substrate 818 (or aperture 820) by the differential between the velocity of the portion of the solution 814 interfacing the aperture 820 and the velocity of the portion of the solution 814 interfacing the substrate 818. The resulting shear force may cause individual nanowires to align along a direction or axis. The solution 814 may be cured or a solvent may be evaporated by a heater 824 or other curing mechanism (e.g., ultraviolet light) so as to fix the alignment of the individual nanowires to the alignment as shown in FIG. 8C. The resulting nanowire film or layer may have substantially anisotropic properties. In particular, in some cases, the nanowire film has a substantially anisotropic sheet resistance due to the orientation of the individual nanowires. In some cases, the nanowire film has an increased transparency for light that is polarized relative to the orientation of the individual nanowires. In some cases, the amount of alignment may be determined or controlled by controlling the curing or evaporation time of the nanowire solution 814.

If curing or evaporation occurs over a longer time, the individual nanowires may drift or deviate from the aligned locations. An example of a substantially randomized distribution is depicted in FIG. 8B. In some cases, the resulting nanowire film or layer having a substantially random orientation of nanowires may have substantially isotropic properties. In particular, in some cases, the nanowire film has a substantially isotropic sheet resistance due to the randomized orientation of the individual nanowires.

Embodiments described herein may be formed in any number of suitable manufacturing processes. For example, in one embodiment, a force-sensitive structure may be formed in a roll-to-roll process which may include depositing a force-sensitive material in a selected pattern on a substrate, bonding said substrate to one or more additional layers or components of an electronic device, and singulating the output of the roll-to-roll process into a plurality of independent force-sensitive structures.

One may appreciate that although many embodiments are disclosed above, that the operations and steps presented with respect to methods and techniques described herein are meant as exemplary and accordingly are not exhaustive. One may further appreciate that alternate step order or, fewer or additional steps may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

I claim:

1. An electronic device having a touch-sensitive surface, the device comprising:
   an enclosure;
   a thin-film transistor (TFT) layer of a liquid-crystal display positioned within the enclosure of the device;
   a cover disposed over the display, the cover forming at least a portion of the touch-sensitive surface of the device;
   a polarizer layer disposed below the TFT layer; and
   a transparent conductive layer disposed adjacent to the polarizer layer and including a metal nanowire material.

2. The device of claim 1, wherein the polarizer layer is a rear polarizer of the liquid-crystal display.

3. The device of claim 1, wherein the transparent conductive layer is disposed adjacent to a lower side of the polarizer layer that is opposite to an upper side that faces the TFT layer.

4. The device of claim 3, wherein the transparent conductive layer includes a substantially randomized distribution of metal nanowires and has a substantially isotropic sheet resistance.

5. The device of claim 1, wherein the transparent conductive layer is disposed adjacent to an upper side of the polarizer layer that faces the TFT layer.

6. The device of claim 5, wherein the metal nanowires of the transparent conductive layer are generally oriented along a first direction and the transparent conductive layer has a substantially anisotropic sheet resistance.

7. The device of claim 5, wherein the metal nanowires are generally oriented along a first direction and the transparent conductive layer is configured to have an increased transparency for light polarized relative to the first direction.

8. The device of claim 1, further comprising:
   an electrode layer disposed below the transparent conductive layer, wherein the electrode layer and the transparent conductive layer are operatively coupled to sensing circuitry and are configured to detect a force on the cover of the device.

9. The device of claim 8, wherein the electrode layer comprises a set of capacitive sensing electrodes.

10. The device of claim 1, further comprising:
    a touch sensor disposed between the cover and the TFT layer of the liquid-crystal display,
    a force sensor disposed below the TFT layer of the liquid-crystal display, wherein the transparent conductive layer shields the touch sensor from electrical noise generated by the force sensor.

11. The device of claim 1, wherein the transparent conductive layer is electrically connected to the TFT layer by a separate electrical connector.

12. The device of claim 1, wherein the transparent conductive layer and the polarizer layer form a flexible laminate, and wherein the transparent conductive layer is electrically connected to the TFT layer by a portion of the flexible laminate bent toward the TFT layer and in electrical contact with the TFT layer.

13. A display stack of an electronic device comprising:
    a thin-film transistor (TFT) layer;
    a polarization layer disposed below the TFT layer;
    a metal nanowire layer disposed below the TFT layer; and
    a display backlight disposed below the metal nanowire layer.

14. The display stack of claim 13, further comprising an array of capacitive sensor electrodes disposed below the backlight, the array of capacitive sensor electrodes coupled to the metal nanowire layer to form a force sensor.

15. The display stack of claim 14, wherein the force sensor comprises a circuit configured to detect a change in capacitance between the array of capacitive sensor electrodes and the metal nanowire layer.

16. The display stack of claim 13, wherein the metal nanowire layer comprises metal nanowires generally oriented along a first direction.

17. The display stack of claim 13, wherein the metal nanowire layer is electrically connected to the TFT layer via a jumper connection.

18. A display stack of an electronic device comprising:
    a thin-film transistor (TFT) layer;
    a display backlight disposed below the TFT layer; and
    a force sensor comprising:
       a metal nanowire layer disposed between the TFT layer and the display backlight; and
       an array of capacitive sensor electrodes disposed below the display backlight.

19. The display stack of claim 18, wherein the metal nanowire layer comprises a substantially randomized distribution of metal nanowires.

20. The display stack of claim 19, wherein the metal nanowire layer has a substantially isotropic sheet resistance.

* * * * *